United States Patent
Suzuki et al.

(10) Patent No.: US 8,269,229 B2
(45) Date of Patent: Sep. 18, 2012

(54) LAYERED SEMICONDUCTOR LIGHT EMITTING DEVICE AND IMAGE FORMING APPARATUS

(75) Inventors: Takahito Suzuki, Tokyo (JP); Tomoki Igari, Tokyo (JP)

(73) Assignee: Oki Data Corporation, Tokyo (JP)

( * ) Notice: Subject to any disclaimer, the term of this patent is extended or adjusted under 35 U.S.C. 154(b) by 429 days.

(21) Appl. No.: 12/461,894

(22) Filed: Aug. 27, 2009

(65) Prior Publication Data
US 2010/0051975 A1 Mar. 4, 2010

(30) Foreign Application Priority Data
Sep. 4, 2008 (JP) .................. 2008-226820

(51) Int. Cl.
*H01L 33/00* (2010.01)
(52) U.S. Cl. ....... 257/88; 257/89; 257/99; 257/E33.056; 257/E33.059
(58) Field of Classification Search .................... 257/88, 257/89, 99, E33.056, E33.059
See application file for complete search history.

(56) References Cited

U.S. PATENT DOCUMENTS
| | | |
|---|---|---|
| 2003/0025657 A1 | 2/2003 | Iwafuchi |
| 2009/0108267 A1 | 4/2009 | Sung |

FOREIGN PATENT DOCUMENTS
| | | |
|---|---|---|
| EP | 1213773 A1 | 6/2002 |
| JP | 3-206673 A | 9/1991 |
| JP | 03-268523 A | 11/1991 |
| JP | 8-202288 A | 8/1996 |
| JP | 08-274376 A | 10/1996 |
| JP | 2001-203427 A | 7/2001 |
| JP | 2006-054336 A | 2/2006 |
| JP | 2006-173326 A | 6/2006 |
| JP | 2006-319149 A | 11/2006 |
| JP | 2007-251209 A | 9/2007 |
| JP | 2007-273898 A | 10/2007 |

*Primary Examiner* — Minh-Loan T Tran
(74) *Attorney, Agent, or Firm* — Rabin & Berdo, P.C.

(57) ABSTRACT

A layered semiconductor light emitting device includes a plurality of semiconductor light emitting elements each of which includes a light emitting region that converts electricity into light and emits the light. The semiconductor light emitting elements are layered in a layering direction perpendicular to the light emitting regions, and are bonded to each other via a planarizing layer having electrical insulation property. The planarizing layer includes a first planarizing region disposed above or below the light emitting regions of the semiconductor light emitting elements in the layering direction and formed of a first planarizing film having higher refractive index than air, and a second planarizing region other than the first planarizing region and formed of a second planarizing film having lower refractive index than the first planarizing film. In the layering direction, the upper semiconductor light emitting element transmits light emitted by the lower semiconductor light emitting element.

10 Claims, 6 Drawing Sheets

LAYERED SEMICONDUCTOR LIGHT EMITTING DEVICE AND IMAGE FORMING APPARATUS

BACKGROUND OF THE INVENTION

The present invention relates to a layered semiconductor light emitting device including a plurality of layers of thin-film semiconductor light emitting elements that emit lights, and an image forming apparatus in which a plurality of such layered semiconductor light emitting devices are integrated.

In order to achieve a thin display, a liquid crystal display (LCD) system and a plasma display system have been developed. The LCD system includes an LCD panel that forms an image or the like by modulating a light emitted by a backlight. The plasma display system includes a plasma display panel of self-luminous type. Both display systems respectively have advantages in terms of brightness, contrast, operation speed, viewing angle, electricity consumption, downsizing, precision or the like, but still have problems to be solved.

In order to solve the problems of these display systems, an organic electroluminescence (i.e., an organic EL) display system and a single-crystal light emitting diode (i.e., a single-crystal LED) display system have attracted attention.

Both of the organic EL display system and the single-crystal LED display system have light sources of self-luminous type, and therefore sufficient properties can be obtained in terms of brightness, contrast, operation speed, viewing angle and electricity consumption. Further, the organic EL display system and the single-crystal LED display system can have simpler configurations compared with the LCD system and plasma display system, and therefore have advantages in reducing size and weight. Further, the organic EL display system and the single-crystal LED display system are expected to be applied to flexible display devices due to their simple structures.

The organic EL display system is advantageous in terms of manufacturing process in that light emitting elements can be formed using printing technique with high precision. That is, a high-precision full-color organic EL system can be manufactured by precisely forming the light emitting elements of red (R), green (G) and blue (B) two-dimensionally. However, the organic EL display system has low light-output efficiency and low reliability compared with the single-crystal LED display system.

In contrast, the single-crystal LED system has high light-output efficiency and high reliability compared with the organic EL display system. However, the single-crystal LED system generally includes cannonball-shaped LED modules for respective pixels, and therefore the size of the single-crystal LED system increases with the number of pixels. In order to manufacture a small-sized display system, it is possible to use bare-chip type single-crystal LEDs. However, even in such a case, the respective bare-chips (i.e., the single-crystal LEDs) need to be diced from a wafer, bonded onto a substrate, and electrically connected using wire bonding, and therefore the manufacturing process becomes complicated. Further, on manufacturing the full-color display system, respective pixels need to be formed by two-dimensionally arranging light emitting elements of red (R), green (G) and blue (B). Therefore, a high resolution and high precision full-color display system is technically difficult to achieve.

For these reasons, Japanese Patent Publication No. 2007-273898 discloses a high-precision full-color LED array using single-crystal LEDs, in which respective light emitting elements of red (R), green (G) and blue (B) are integrated in small areas.

The publication discloses the LED array in which bare-chip type single-crystal LEDs of red (R), green (G) and blue (B) are layered in a direction perpendicular to a light emitting surface. In other words, the LEDs of respective colors are three-dimensionally integrated in small areas. With such a configuration, a high precision image forming apparatus using the single-crystal LEDs having high light-output efficiency and reliability can be obtained.

However, in the LED array disclosed in the above described publication, bonding electrodes need to be formed on a top surface or a bottom surface of each LED. The bonding electrodes of respective LEDs are bonded to each other. Therefore, air layer (with a thickness corresponding to that of the bonding electrode) may be formed between the LEDs. Such air layer causes a difference in refractive index when the light emitted by the LED proceeds into the air layer. Therefore, light-output efficiency of the LEDs decreases. Further, the air layer may be formed at random in between the LEDs, and therefore an amount of leakage light that proceeds laterally in the air layer may increase. As a result, combined light-output efficiency of the LEDs may decrease. Further, when the LEDs are integrated three-dimensionally at high density, the leakage light (proceeding laterally in the air layer) may interface with the light emitted by the adjacent LED, and may change color tone of the light. Furthermore, the bonding electrodes may block the light emitted by the LEDs, with the result that light-output efficiency may decrease.

SUMMARY OF THE INVENTION

The present invention is intended to provide a layered semiconductor light emitting device capable of reducing leakage of light to thereby enhance light-output efficiency, and to provide an image forming apparatus using such a layered semiconductor light emitting device.

The present invention provides a layered semiconductor light emitting device including a plurality of semiconductor light emitting elements each of which includes a light emitting region that converts electricity into light and emits the light. The semiconductor light emitting elements are layered in a layering direction perpendicular to the light emitting regions. The semiconductor light emitting elements are bonded to each other via a planarizing layer having electrical insulation property. The planarizing layer includes a first planarizing region disposed above or below the light emitting regions of the semiconductor light emitting elements in the layering direction and formed of a first planarizing film having higher refractive index than air, and a second planarizing region other than the first planarizing region and formed of a second planarizing film having lower refractive index than the first planarizing film. In the layering direction of the semiconductor light emitting elements, the semiconductor light emitting element disposed on an upper side transmits light emitted by the semiconductor light emitting element disposed on a lower side.

With such an arrangement, the light emitted by the semiconductor light emitting element below the first planarizing film is conducted by the first planarizing film (i.e., an optical waveguide structure), and is incident on the semiconductor light emitting elements above the first planarizing film. Since the semiconductor light emitting elements are bonded to each other via the planarizing layer, no air layer is formed between semiconductor light emitting elements. Therefore, combined light-output efficiency of the semiconductor light emitting elements is obtained.

Moreover, since the first planarizing film has higher refractive index than air, leakage of light can be prevented, and light-output efficiency can be further enhanced. For example, the semiconductor light emitting element is preferably bonded onto the planarizing layer by means of intermolecular force. In such a case, a material that blocks light can be minimized, and therefore light-output efficiency can be further enhanced.

The present invention also provides a layered semiconductor light emitting device including a plurality of semiconductor light emitting elements each of which includes a light emitting region that converts electricity into light and emits the light. The semiconductor light emitting elements are layered in a layering direction perpendicular to the light emitting regions. The semiconductor light emitting elements are bonded to each other via a planarizing layer having electrical insulation property. The planarizing layer includes a first planarizing region disposed above or below the light emitting regions of the semiconductor light emitting elements in the layering direction, a second planarizing region other than the first planarizing region, and a separation groove of air layer formed between the first planarizing region and the second planarizing region so as to create a difference in refractive index. In the layering direction of the semiconductor light emitting elements, the semiconductor light emitting element disposed on an upper side transmits light emitted by the semiconductor light emitting element disposed on a lower side.

Since the separation groove creates a difference in refractive index, an optical waveguide structure is formed above the light emitting region, and therefore a process for forming the optical waveguide structure can be simplified, in addition to the above described advantages.

The present invention also provides an image forming apparatus including a plurality of the layered semiconductor light emitting devices, and a substrate on which the layered semiconductor light emitting devices are arranged one-dimensionally or two-dimensionally.

With such a configuration, each pixel (i.e., the layered semiconductor light emitting device) is not subject to influence by leakage light from adjacent pixel. As a result, a full-color image forming apparatus with high efficiency can be obtained.

Further scope of applicability of the present invention will become apparent from the detailed description given hereinafter. However, it should be understood that the detailed description and specific embodiments, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Hereinafter, embodiments and examples of the present invention will be described with reference to the attached drawings. In this regard, the present invention is not limited to the embodiments, but can be modified without departing from the scope of the invention.

Embodiment 1

<Structure>

Figure 1:
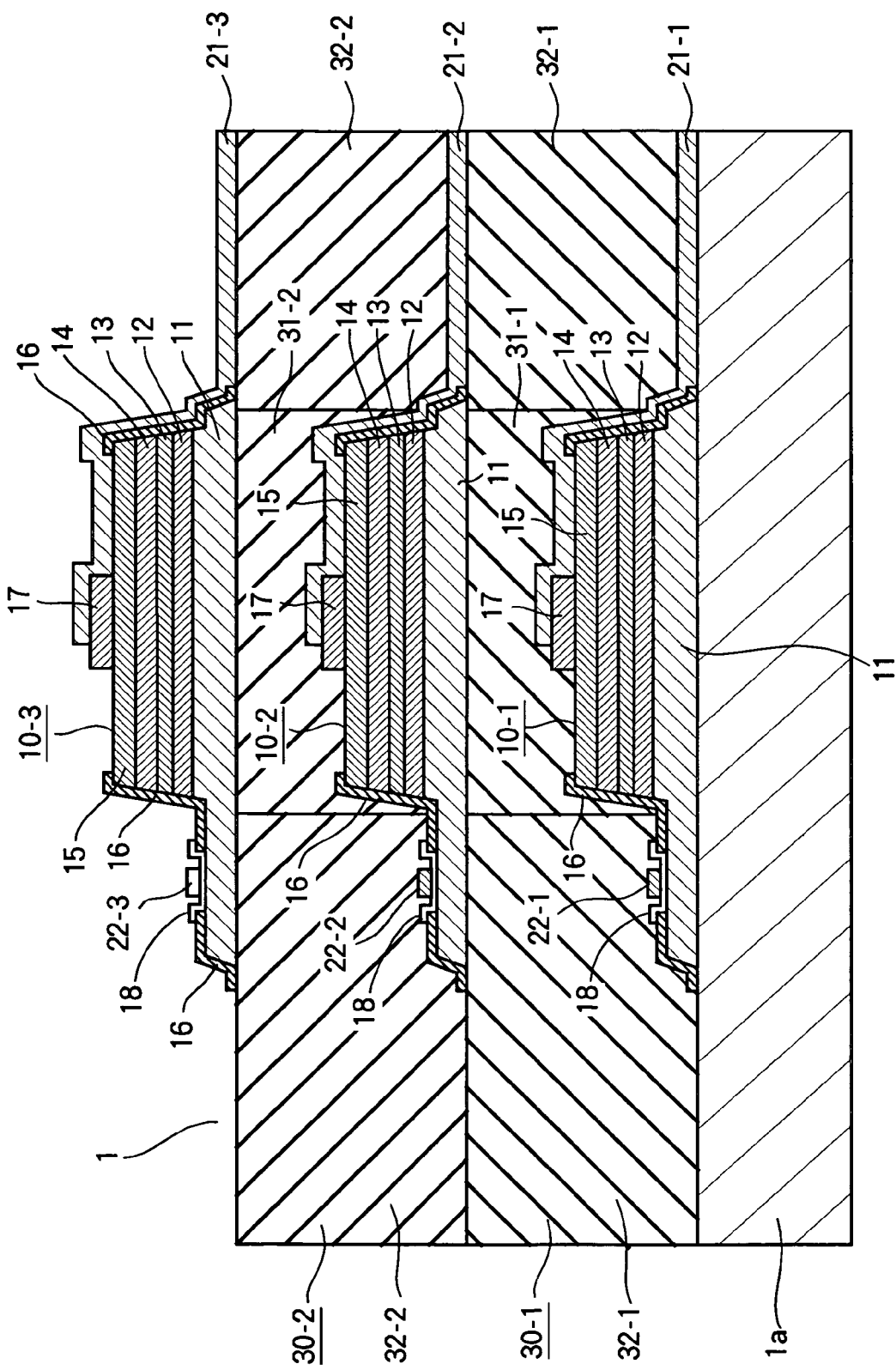
FIG. 1 is a sectional view showing an enlarged layered semiconductor light emitting device according to Embodiment 1 of the present invention, taken along line I-I in FIG. 2.
Figure 2:
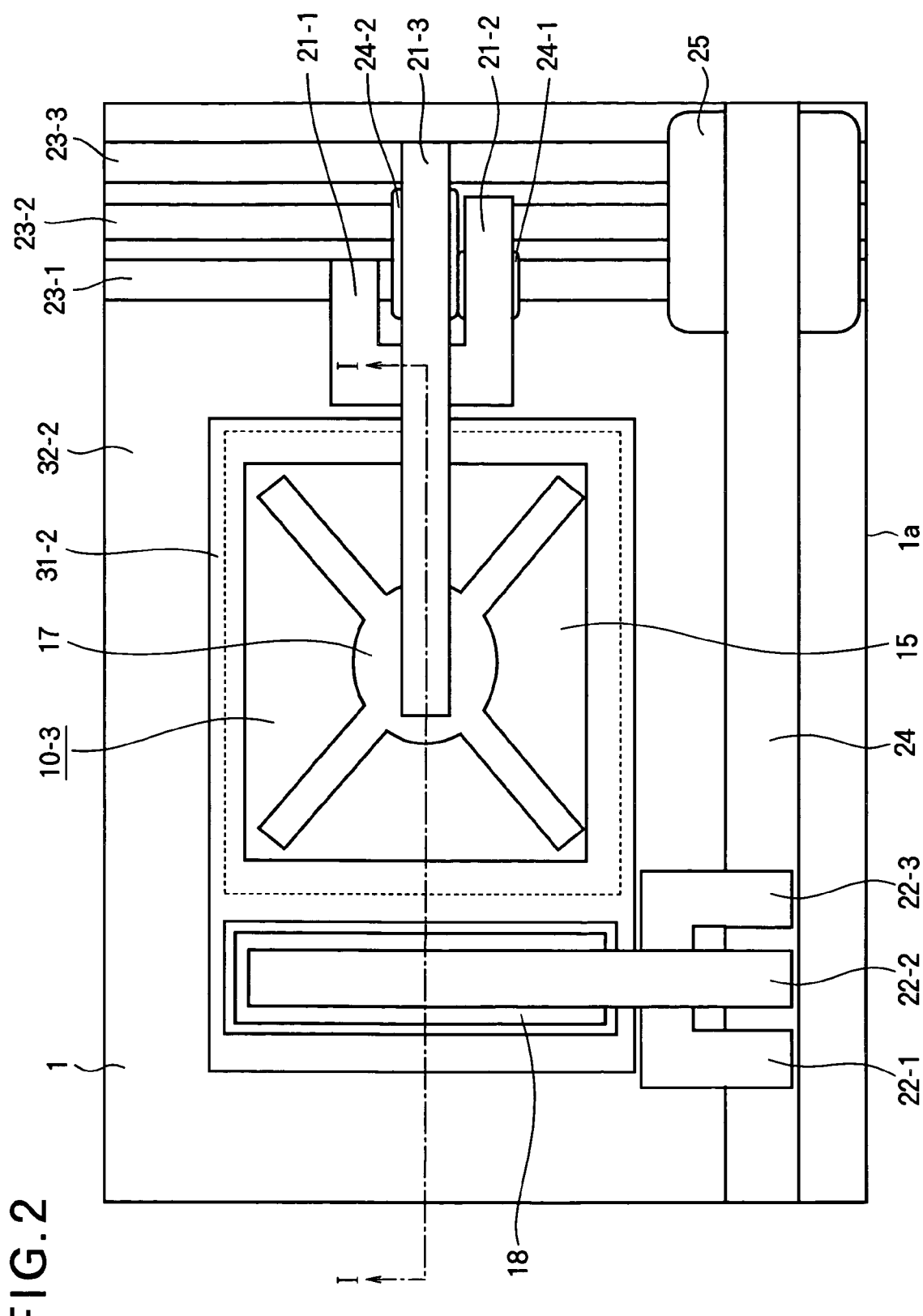
FIG. 2 is an enlarged plan view showing the layered semiconductor light emitting device according to Embodiment 1 of the present invention.

FIG. 1 is an enlarged sectional view showing a layered semiconductor light emitting device according to Embodiment 1 of the present invention, taken along line I-I in FIG. 2. FIG. 2 is a plan view showing the layered semiconductor light emitting device according to Embodiment 1 of the present invention. The layered semiconductor light emitting device (i.e., a color layered semiconductor light emitting device) includes a plurality of (for example, three) light emitting elements layered in a direction perpendicular to a light emitting surface.

The layered semiconductor light emitting device 1 of Embodiment 1 is configured to emit light upward, and has a display surface on an upper side in FIG. 1. The layered semiconductor light emitting device 1 includes a supporting substrate 1*a* on which a first-layer semiconductor light emitting element 10-1 is formed. The first-layer semiconductor light emitting element 10-1 can be preliminarily formed on a base material, be separated from the base material, and be fixed to the supporting substrate 1*a*. Alternately, the first-layer semiconductor light emitting element 10-1 can be directly formed (grown) on the supporting substrate 1*a*. The first-layer semiconductor light emitting element 10-1 is, for example, an LED composed of a semiconductor thin film having a light emitting region that converts electricity into light and emits radiation light having longer wavelength (Red light). The first-layer semiconductor light emitting element 10-1 is covered with a first-layer planarizing layer 30-1. The first-layer planarizing layer 30-1 includes a first planarizing region disposed above the light emitting region of the light emitting element 10-1 and a second planarizing region other than the first planarizing region (more specifically, disposed around the first planarizing region). The first planarizing region is composed of a first planarizing film 31-1 with high refractive index, and a second planarizing film 32-1 with low refractive index.

A second-layer semiconductor light emitting element 10-2 is bonded onto the first-layer planarizing layer 30-1 by means of intermolecular force. The second-layer semiconductor light emitting element 10-2 is, for example, an LED composed of a semiconductor thin film that converts electricity into light and emits radiation light (Green light) whose wavelength is shorter than Red light. The second-layer semiconductor light emitting element 10-2 is covered with a second-layer planarizing layer 30-2. The second-layer planarizing layer 30-2 includes a first planarizing region disposed above the light emitting region of the light emitting element 10-2 and a second planarizing region other than the first planarizing region (more specifically, disposed around the first planarizing region), as is the case with the first-layer planarizing layer 30-1. The first planarizing region is composed of a first planarizing film 31-2 with high refractive index, and a second planarizing film 32-2 with low refractive index.

A third-layer semiconductor light emitting element 10-3 is bonded onto the second-layer semiconductor light emitting element 10-2 by means of intermolecular force. The third-layer semiconductor light emitting element 10-3 is, for example, an LED composed of a semiconductor thin film that converts electricity into light and emits radiation light (Blue light) whose wavelength is shorter than Green light.

The layered semiconductor light emitting device 1 of Embodiment 1 is characterized in that portions between the semiconductor light emitting elements 10-1, 10-2 and 10-3 are respectively filled with the planarizing layers 30-1 and 30-2 each of which includes two kinds of planarizing films 31-1 and 32-1 (31-2 and 32-2) with different refractive indexes. The planarizing layers 30-1 and 30-2 have a function to reduce concaves and convexes in the layering process of the respective semiconductor light emitting elements 10-1, 10-2 and 10-3 so as to enhance bonding strength therebetween. The first planarizing films 31-1 and 31-2 disposed above or below the light emitting regions of the respective semiconductor light emitting elements 10-1, 10-2 and 10-3 are formed of material with high refractive index than the second planarizing films 32-1 and 32-2 disposed around the first planarizing films 31-1 and 31-2.

The planarizing films 31-1, 31-2, 32-1 and 32-2 are formed of organic insulation material such as Novolak-base resist, acrylic resin, polyimide resin, epoxy resin, SOG (Spin coating On Glass) or the like, or inorganic material such as SiN, $SiO_2$, $Al_2O_3$ or the like. The surfaces of the planarizing films 31-1, 31-2, 32-1 and 32-2 are planarized by polishing or the like.

The semiconductor light emitting elements 10-2 and 10-3 are bonded onto the planarizing layers 30-1 and 30-2 (more specifically, on the first planarizing film 31-1 and 31-2) by means of intermolecular force between the semiconductor layers of the semiconductor light emitting element 10-2 and 10-3 and the planarizing layers 30-1 and 30-2. Bonding electrodes (which were conventionally used for bonding) are not provided on bonding surfaces. In the case where the three semiconductor light emitting elements 10-1, 10-2 and 10-3 are layered in this order from the bottom and a display surface is disposed on the upper side, the semiconductor light emitting element 10-3 is composed of material that does not absorb the lights emitted by the semiconductor light emitting elements 10-1 and 10-2. Further, the semiconductor light emitting element 10-2 is composed of material that does not absorb the light emitted by the semiconductor light emitting element 10-1. For this reason, the semiconductor light emitting elements 10-1, 10-2 and 10-3 are layered in the descending order of band-gap wavelength (i.e., in the order of Red, Green and Blue) from the bottom.

Each of the semiconductor light emitting elements 10-1, 10-2 and 10-3 is composed of a semiconductor layer including a lower contact layer 11, a lower cladding layer 12, an active layer 13, an upper cladding layer 14 and an upper contact layer 15 layered in this order from the bottom. The semiconductor light emitting elements 10-1, 10-2 and 10-3 are formed by epitaxial growth. Further, each of the semiconductor light emitting elements 10-1, 10-2 and 10-3 preferably has a thickness thinner than or equal to approximately 5 μm.

Each of the semiconductor light emitting elements 10-1, 10-2 and 10-3 is covered with an interlayer insulation film 16. Upper contact openings are formed on the interlayer insulation films 16, and are disposed on substantially entire parts of the upper contact layers 15. Lower contact openings are formed on the interlayer insulation films 16, and are disposed on parts of the lower contact layers 11. Upper electrodes 17 are formed on center portions of the upper contact layers 15 within the upper contact openings. Lower electrodes 18 are formed on the lower contact layers 11 within the lower contact openings. The upper electrodes 17 are preferably composed of transparent electrodes such as ITO (Indium Tin Oxide), so as not to block the lights emitted from the semiconductor light emitting elements 10-1, 10-2 and 10-3.

A first-layer upper electrode wiring 21-1 is connected to the upper electrode 17 of the first-layer semiconductor light emitting element 10-1. The first-layer upper electrode wiring 21-1 extends to the right in FIG. 1, and extends over the upper contact layer 15, the interlayer insulation film 16 and the supporting substrate 1a. Further, a first-layer lower electrode wiring 22-1 is connected to the lower electrode 18 of the first-layer semiconductor light emitting element 10-1. The first-layer lower electrode wiring 22-1 extends in a direction perpendicular to a plane of the paper of FIG. 1. The first upper electrode wiring 21-1 and the first-layer lower electrode wiring 22-1 are covered with the first-layer planarizing layer 30-1.

A second-layer upper electrode wiring 21-2 is connected to the upper electrode 17 of the second-layer semiconductor light emitting element 10-2. The second-layer upper electrode wiring 21-2 extends to the right in FIG. 1, and extends over the upper contact layer 15, the interlayer insulation film 16 and the second planarizing film 32-1 of the first-layer planarizing layer 30-1. Further, a second-layer lower electrode wiring 22-2 is connected to the lower electrode 18 of the second-layer semiconductor light emitting element 10-2. The second-layer lower electrode wiring 22-2 extends in a direction perpendicular to the plane of the paper of FIG. 1. The second upper electrode wiring 21-2 and the second-layer lower electrode wiring 22-2 are covered with the second-layer planarizing layer 30-2.

A third-layer upper electrode wiring 21-3 is connected to the upper electrode 17 of the third-layer semiconductor light emitting element 10-3. The third-layer upper electrode wiring 21-3 extends to the right in FIG. 1, and extends over the upper contact layer 15, the interlayer insulation film 16 and the second planarizing film 32-2 of the second-layer planarizing layer 30-2. Further, a third-layer lower electrode wiring 22-3 is connected to the lower electrode 18 of the third-layer semiconductor light emitting element 10-3. The third-layer lower electrode wiring 22-3 extends in a direction perpendicular to the plane of the paper of FIG. 1.

FIG. 2 is an enlarged plan view showing the layered semiconductor light emitting device 1 shown in FIG. 1 according to Embodiment 1.

The upper electrode 17 formed on the upper contact layer 15 of each of the semiconductor light emitting elements 10-1, 10-2 and 10-3 includes a circular portion disposed at a center of the upper contact layer 15 and a plurality of branch portions radially extending from the circular portion so as to supply electric current entirely to the light emitting surface. The first, second and third-layer upper electrode wirings 21-1, 21-2 and 21-3 connected to the upper electrodes 17 of the semiconductor light emitting elements 10-1, 10-2 and 10-3 extend to the right in FIG. 2.

For example, upper electrode common wirings 23-1, 23-2 and 23-3 are formed on the second planarizing film 32-2 of the second-layer planarizing layer 30-2 at predetermined intervals (so as to vertically extend in a right part in FIG. 2), respectively corresponding to the first, second and third upper electrode wirings 21-1, 21-2 and 21-3. The first-layer upper electrode wiring 21-1 extends upward via a not shown through-hole electrode or the like, and is connected to the first-layer upper electrode common wiring 23-1. The second-layer upper electrode wiring 21-2 extends upward via a not shown through-hole electrode or the like, crosses over an upper wiring interlayer insulation film 24-1 formed on the first-layer upper electrode common wiring 23-1, and is connected to the second-layer upper electrode common wiring 23-2. The third-layer upper electrode wiring 21-3 crosses over an upper wiring interlayer insulation film 24-2 formed on the first-layer upper electrode common wiring 23-1 and the second-layer upper electrode common wiring 23-2, and is connected to the third-layer upper electrode common wiring 23-3.

Further, a lower electrode common wiring 24 is formed on the second planarizing film 32-2 of the second-layer planarizing layer 30-2 (so as to extend laterally in a lower part in FIG. 2). The lower electrode common wiring 24 crosses over a common wiring interlayer insulation film 25 disposed on the upper electrode common wirings 23-1, 23-2 and 23-3 with an overpass. The first-layer, second-layer and third-layer lower electrode wirings 22-1, 22-2 and 22-3 extend upward via not shown through-hole electrodes or the like, and are connected to the lower electrode common wiring 24.

For example, the upper electrode common wirings 23-1, 23-2 and 23-3 are connected to an external drive circuit. The lower electrode common wiring 24 is connected to a ground. The first, second and third upper electrode wirings 21-1, 21-2 and 21-3 can be applied with current independently via the upper electrode common wirings 23-1, 23-2 and 23-3. By controlling current values applied to the semiconductor light emitting elements 10-1, 10-2 and 10-3, a full-color light can be emitted.

<Manufacturing Method>

FIGS. 3A through 3E show an example of a manufacturing method of the layered semiconductor light emitting device 1 according to Embodiment 1.

Figure 3A:
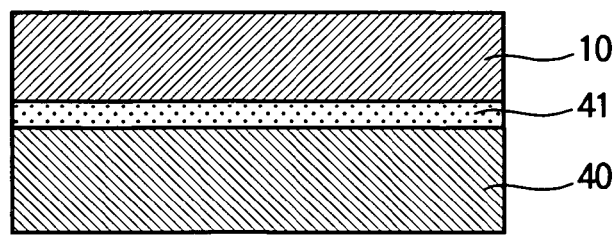
FIGS. 3A through 3E are schematic sectional views for illustrating an example of a manufacturing process of the layered semiconductor light emitting device according to Embodiment 1 of the present invention.

In order to manufacture the layered semiconductor light emitting device 1 shown in FIGS. 1 and 2, first, a mother substrate 40 as a crystal-growing substrate is prepared as shown in FIG. 3A. The mother substrate 40 is composed of, for example, a GaAs substrate, a sapphire substrate, an InP substrate, a quarts substrate, a Si substrate or the like. Then, a sacrificial layer 41 is formed on the mother substrate 40. The sacrificial layer 41 is formed of material selectively etchable with respect to the mother substrate 40 and also selectively etchable with respect to a semiconductor light emitting element layer 10 (i.e., a single-crystal semiconductor thin film) which is to be formed on the sacrificial layer 41. After the sacrificial layer 41 is formed, the semiconductor light emitting element layer 10 is formed on the sacrificial layer 41 using semiconductor crystal growth method (i.e., epitaxial growth method) such as metal-organic chemical vapor deposition (MOCVD) method, Metal-Organic Vapor Phase Epitaxy (MOVPE) method or Molecular Beam Epitaxy (MBE) method or the like. The semiconductor light emitting element layer 10 is a single-crystal semiconductor thin film having layered structure. The thickness of the semiconductor light emitting element layer 10 is preferably thinner than or equal to approximately 5 µm.

Figure 3B:
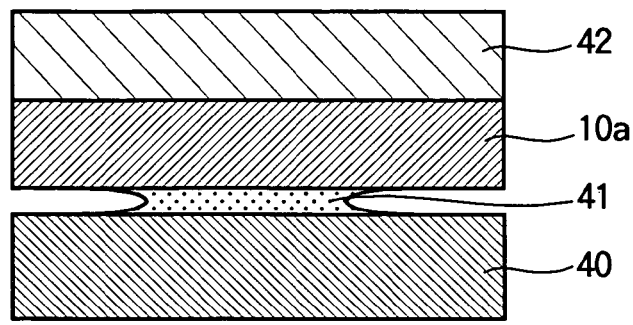

In a process shown in FIG. 3B, the semiconductor light emitting element layer 10 is selectively etched using photo-lithographic technology, so as to form a semiconductor light emitting element pattern 10a having a rectangular shape and to expose the sacrificial layer 41. Then, a supporting body 42 is formed on the semiconductor light emitting element pattern 10a. Then, the sacrificial layer 41 is etched using etching solution. FIG. 3B shows a state during the etching of the sacrificial layer 41.

Figure 3C:
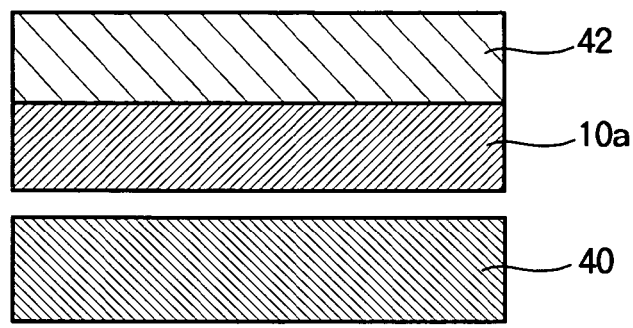

In a process shown in FIG. 3C, the sacrificial layer 41 is completely removed by etching, and the semiconductor light emitting element pattern 10a *is separated from the mother substrate 40*.

Figure 3D:
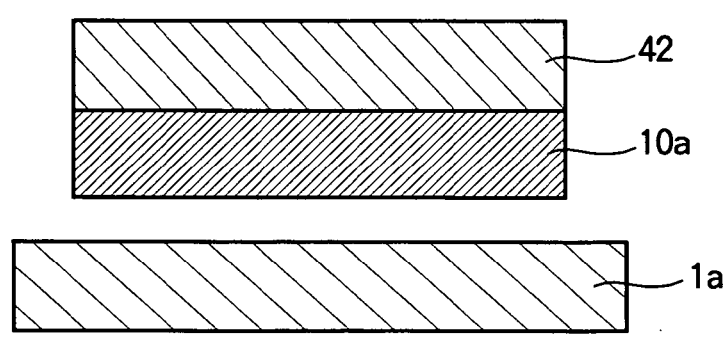

In a process shown in FIG. 3D, the supporting substrate 1a such as a glass substrate or the like is prepared. The semiconductor light emitting element pattern 10a held by the supporting body 42 is positioned above and with respect to the supporting substrate 1a.

Figure 3E:
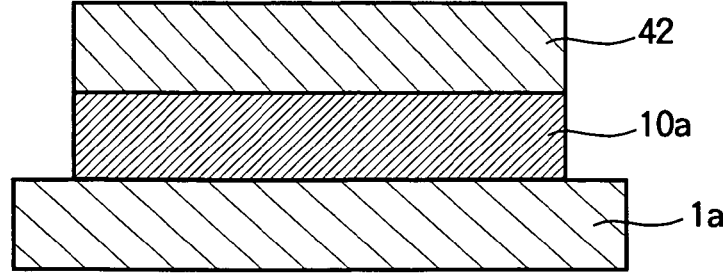

In a process shown in FIG. 3E, a backside of the semiconductor light emitting element pattern 10a held by the supporting body 42 is pressed against (and is brought in tight contact with) a surface of the supporting substrate 1a so that the semiconductor light emitting element pattern 10a is bonded onto the supporting substrate 1a by means of intermolecular force between bonding surfaces. After the bonding is completed, the supporting body 42 is removed using a parting agent (i.e. remover).

After the semiconductor light emitting element pattern 10a is bonded onto the supporting substrate 1a, the semiconductor light emitting element pattern 10a is formed into the first-layer semiconductor light emitting element 10-1 having the LED structure as shown in FIG. 1 using photolithographic technique or etching technique. Further, using chemical vapor deposition (CVD) method or the like, the interlayer insulation film 16 of an SiN film, an organic insulation film or the like is formed to entirely cover the first-layer semiconductor light emitting element 10-1. Using photolithographic technology, the interlayer insulation film 16 except on upper and side surfaces of the semiconductor light emitting element 10-1 is removed, and the lower electrode opening and the upper electrode opening are formed on parts of the interlayer insulation film 16 on the semiconductor light emitting element 10-1.

The upper electrode 17 is formed within the upper electrode opening, and the lower electrode 18 is formed within the lower electrode opening. The upper electrode 17 is preferably formed of a transparent electrode so as not to block the light from the semiconductor light emitting element 10-1 disposed below the upper electrode 17. Furthermore, the upper electrode wiring 21-1 is selectively formed on parts of the upper electrode 17, the upper electrode opening, the interlayer insulation film 16 and the supporting substrate 1a. The lower electrode wiring 22-1 is formed on the lower electrode 18.

Then, a planarizing layer with high refractive index is formed to entirely cover the first-layer semiconductor light emitting element 10-1 using organic insulation material (for example, Novolak-based permanent resist, acrylic resin, polyimide resin, epoxy resin, SOG or the like) or inorganic insulation material (for example, SiN, SiO$_2$, Al$_2$O$_3$ or the like). The planarizing layer is patterned so as to leave a portion above the light emitting region of the first-layer semiconductor light emitting element 10-1. As a result, the first planarizing film 31-1 is formed. Then, another planarizing layer with low refractive index is formed to entirely cover the first planarizing film 31-1 using organic insulation material or inorganic insulation material substantially the same as the first planarizing film 31-1. Then, the planarizing layer with low refractive index is polished until that the first planarizing film 31-1 is exposed. As a result, the second planarizing film 32-1 is formed around the first planarizing film 31-1. Thereafter, the surfaces of the first planarizing film 31-1 and the second planarizing film 32-1 are finished (polished), and the first-layer planarizing layer 30-1 is formed.

In this regard, the surfaces of the first planarizing film 31-1 and the second planarizing film 32-1 are preferably polished so that peak-to-valley surface roughness Ry of the first planarizing film 31-1 and the second planarizing film 32-1 is less than or equal to 5 µm.

Next, a second-layer semiconductor light emitting element layer (G), which has been preliminarily formed on a mother substrate 40 as is the case with the first-layer semiconductor light emitting element 10-1, is bonded onto the first-layer planarizing layer 30-1 using intermolecular force between the semiconductor layer of the second-layer semiconductor light emitting element layer (G) and the first-layer planarizing layer 30-1. The bonding is performed using intermolecular force, and therefore bonding electrodes (which were conventionally used for bonding) are not provided on bonding surfaces. Using photolithographic technology or etching technology, the second-layer semiconductor light emitting element layer (G) is formed into the second-layer semiconductor light emitting element 10-2 having the LED structure. The second-layer semiconductor light emitting element 10-2 is disposed on the first planarizing film 31-1 with high refractive index of the first-layer planarizing layer 30-1.

Then, the interlayer insulation film 16, the upper electrode 17, the lower electrode 18, the upper electrode wiring 21-2 and the lower electrode wiring 22-2 are selectively formed with respect to the second-layer semiconductor light emitting element 10-2 as is the case with the first-layer semiconductor light emitting element 10-1. Furthermore, the second-layer planarizing layer 30-2 including the first planarizing film 31-2 with high refractive index and the second planarizing film 32-2 with low refractive index is formed to cover the second-layer semiconductor light emitting element 10-2.

Further, a third-layer semiconductor light emitting element layer (B), which has been preliminarily formed on a mother substrate 40 as is the case with the second-layer semiconductor light emitting element 10-2, is bonded onto the second-layer planarizing layer 30-2 using intermolecular force between the semiconductor layer of the third-layer semiconductor light emitting element layer (B) and the second-layer planarizing layer 30-2. Using photolithographic technique or etching technique, the third-layer semiconductor light emitting element layer (B) is formed into the third-layer semiconductor light emitting element 10-3 having the LED structure. The third-layer semiconductor light emitting element 10-3 is disposed on the second planarizing film 32-1 with high refractive index of the second-layer planarizing layer 30-2.

Thereafter, the interlayer insulation film 16, the upper electrode 17, the lower electrode 18, the upper electrode wiring 21-3 and the lower electrode wiring 22-3 are selectively formed with respect to the third-layer semiconductor light emitting element 10-3 as is the case with the second-layer semiconductor light emitting element 10-2. Further, the upper electrode common wirings 23-1, 23-2 and 23-3 and the lower electrode common wirings 24 are selectively formed on the second planarizing film 32-2 of the second-layer planarizing layer 30-2. The upper electrode wirings 21-1, 21-2 and 21-3 are connected to the upper electrode common wirings 23-1, 23-2 and 23-3. The lower electrode wirings 22-1, 22-2 and 22-3 are connected to the lower electrode common wiring 24. As a result, the manufacturing process of the layered semiconductor light emitting device 1 as shown in FIGS. 1 and 2 is completed.

<Operation>

For example, in FIG. 2, the lower electrode common wiring 24 is given a ground potential, and the upper electrode common wirings 23-1, 23-2 and 23-3 are applied with positive potential. In such a case, a drive current flows through the upper electrode common wirings 23-1, 23-2 and 23-3, the upper electrode wirings 21-1, 21-2 and 21-3 of the respectively layers, the upper electrodes 17 of the respective semiconductor light emitting elements 10-1, 10-2 and 10-3, the lower electrodes 18 of the respective semiconductor light emitting elements 10-1, 10-2 and 10-3, the lower electrode wirings 22-1, 22-2 and 22-3 of the respectively layers, and the lower electrode common wiring 24. With the drive current, the active layers 13 of the semiconductor light emitting elements 10-1, 10-2 and 10-3 emit lights. The emitted lights pass through the first planarizing films 31-1 and 31-2 with high refractive index, and emerge in the upward direction.

In this regard, the respective semiconductor light emitting elements 10-1, 10-2 and 10-3 are integrated via the planarizing layers 30-1 and 30-2 each of which includes two kinds of planarizing films 31-1 and 32-1 (31-2 and 32-2) with different refractive index and layered in the direction perpendicular to the light emitting surface of the semiconductor light emitting element. The first planarizing films 31-1 and 31-2 disposed above the light emitting regions of the semiconductor light emitting elements 10-1 and 10-2 are formed of material with higher refractive index than the second planarizing films 32-1 and 32-2 disposed on the other portion. Therefore, the lights emitted by the semiconductor light emitting elements 10-1 and 10-2 are conducted through the first planarizing films 31-1 and 31-2 with high refractive index, and are respectively incident on the light emitting regions of the semiconductor light emitting element 10-2 and 10-3.

Further, the respective semiconductor light emitting elements 10-2 and 10-3 are integrated on the first planarizing layers 31-1 and 31-2 by means of intermolecular force, and therefore the lights from the semiconductor light emitting elements 10-1 and 10-2 are not blocked by bonding metal layer or the like and are efficiently conducted. Additionally, the semiconductor layers constituting the semiconductor light emitting elements 10-2 and 10-3 are formed of material that does not absorb the light emitted by the semiconductor light emitting element 10-1, and therefore the light can be efficiently conducted.

<Effect>

According to Embodiment 1 of the present invention, the respective semiconductor light emitting elements 10-1, 10-2 and 10-3 are integrated via the planarizing layers 30-1 and 30-2 using intermolecular force between the respective semiconductor layers and the respective planarizing layers. The first planarizing films 31-1 and 31-2 disposed on the light emitting regions have higher refractive index than the second planarizing films 32-1 and 32-2 disposed on other than the light emitting regions. Therefore, the lights emitted by the semiconductor light emitting elements 10-1 and 10-2 below the first planarizing films 31-1 and 31-2 are conducted through the first planarizing films 31-1 and 31-2 (having optical waveguide structures), and are incident on the semiconductor light emitting elements 10-2 and 10-3 respectively disposed on the first planarizing films 31-1 and 31-2. Accordingly, it becomes possible to prevent formation of air layer between the respective semiconductor light emitting elements as in the conventional semiconductor light emitting device (in which the semiconductor light emitting elements are bonded using bonding electrodes). Thus, leakage of light can be prevented, and combined light-output efficiency of the respective semiconductor light emitting elements can be enhanced.

Furthermore, the semiconductor light emitting elements 10-1, 10-2 and 10-3 are bonded by means of intermolecular force without using bonding electrodes, and therefore material that may block the light can be minimized. Thus, light-output efficiency can be enhanced. Moreover, the semiconductor light emitting elements 10-1, 10-2 and 10-3 are bonded using the first planarizing films 31-1 and 31-2 with higher refractive index than the air layer (and without allowing the formation of air layer as in the conventional semiconductor light emitting device), and therefore light-output efficiency of the semiconductor light emitting elements 10-1, 10-2 and 10-3 can be further enhanced.

Modifications

Various kinds of modification can be made to the structure and manufacturing method of the layered semiconductor light emitting device 1 according to Embodiment 1 as follows.

(A) The first-layer semiconductor light emitting element 10-1 can also be formed on a crystal-growing substrate by epitaxial growth. In such a case, the crystal-growing substrate (on which the first-layer semiconductor light emitting element 10-1 is grown) can be used as the supporting substrate 1a.

(B) In the process shown in FIG. 3A, if the semiconductor light emitting elements 10-1, 10-2 and 10-3 are formed of compound semiconductor (for example, GaN or the like) with respect to which the sacrificial layer 41 is not selectively etchable, it is also possible to polish the crystal-growing substrates (on which the semiconductor light emitting elements 10-1, 10-2 and 10-3 are grown) to thereby obtain epitaxially grown layers having the thickness of approximately 5 µm or less. The resultant epitaxially grown layers can be used as semiconductor light emitting elements 10-1, 10-2 and 10-3.

(C) The planarizing films 31-1 and 32-1 and the planarizing films 31-2 and 32-2 can be formed as follows: The planarizing film composed of material with high refractive index is formed on the first-layer semiconductor light emitting element 10-1 (or on the second-layer semiconductor light emitting element 10-2). The planarizing film is patterned so as to form the first planarizing film 31-1 (or the first planarizing film 31-2) above the light emitting region. Then, the second planarizing film 32-1 (or the second planarizing film 32-2) of material with low refractive index is formed to entirely cover the first planarizing film 31-1 (or the first planarizing film 31-2). The surfaces of the planarizing films 31-1 and 32-1 (or the surfaces of the planarizing films 32-1 and 32-2) are polished so as to be aligned with each other. Then, the semiconductor light emitting elements 10-2 and 10-3 are mounted on the first planarizing film 31-1 (or the first planarizing film 31-2) with high refractive index so that the light emitting regions of the semiconductor light emitting element 10-2 (or the third-layer semiconductor light emitting element 10-3) is aligned with the first planarizing film 31-1 (or the first planarizing film 31-2).

(D) It is only necessary that the layered semiconductor light emitting device 1 includes at least two semiconductor light emitting elements selected among the semiconductor light emitting element 10-1 that emits red light, the semiconductor light emitting element 10-2 that emits green light, and the semiconductor light emitting element 10-3 that emits blue light.

Embodiment 2

Figure 4:
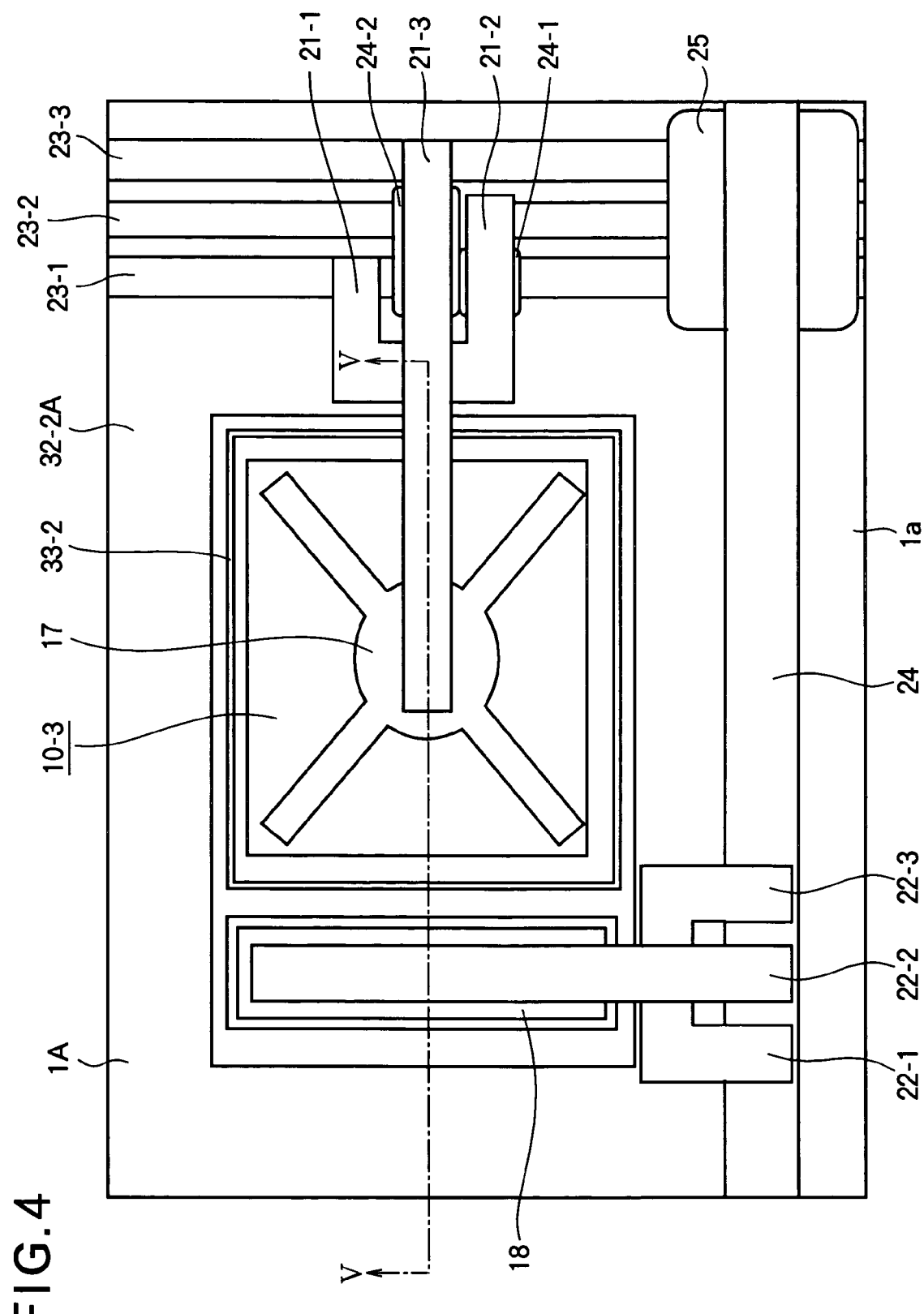
FIG. 4 is an enlarged plan view showing a layered semiconductor light emitting device according to Embodiment 2 of the present invention.
Figure 5:
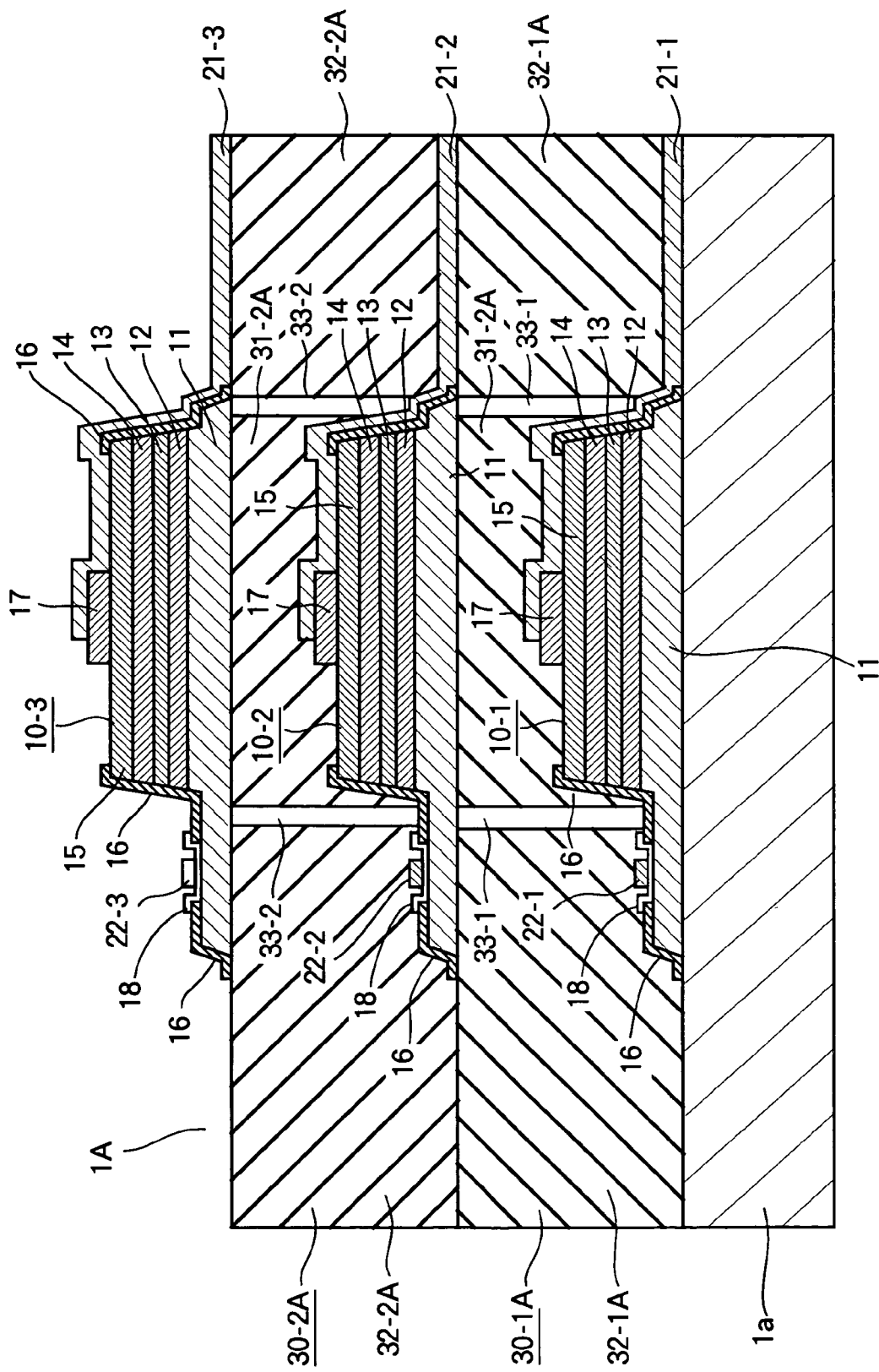
FIG. 5 is an enlarged sectional view showing the layered semiconductor light emitting device according to Embodiment 2 of the present invention, taken along line V-V in FIG. 4.

FIG. 4 is an enlarged plan view showing a layered semiconductor light emitting device according to Embodiment 2 of the present invention. FIG. 5 is a sectional view taken along line V-V in FIG. 4. In FIGS. 4 and 5, components that are the same as those of Embodiment 1 (FIGS. 1 and 2) are assigned the same reference numerals. In FIGS. 4 and 5, the layered semiconductor light emitting device (i.e., a color layered semiconductor light emitting device) 1A includes a plurality of (for example, three) light emitting elements layered in a direction perpendicular to a light emitting surface as in Embodiment 1.

The layered semiconductor light emitting device 1A of Embodiment 2 includes a first-layer planarizing layer 30-1A and a second-layer planarizing layer 30-2A instead of the first-layer planarizing layer 30-1 and the second-layer planarizing layer 30-2 of Embodiment 1 (FIG. 2). The first-layer planarizing layer 30-1A and the second-layer planarizing layer 30-2A respectively have different structures from the first-layer planarizing layer 30-1 and the second-layer planarizing layer 30-2 of Embodiment 1.

Each of the first-layer planarizing layer 30-1A and the second-layer planarizing layer 30-2A has a first planarizing region disposed above or below the light emitting region of the semiconductor light emitting elements 10-1, 10-2 and 10-3, a second planarizing region other than (more specifically, disposed around) the first planarizing region, and separation grooves 33-1 and 33-2 disposed so as to surround the first planarizing region (i.e., so as to surround the light emitting region). The separation grooves 33-1 and 33-2 are composed of air layer for forming difference in refractive index. In the first-layer planarizing layer 30-1A, the first planarizing region is formed of a first planarizing film 31-1A, and the second planarizing region is formed of a second planarizing film 32-1A composed of the same material as the first planarizing film 31-1A. In the second-layer planarizing layer 30-2A, the first planarizing region is formed of a first planarizing film 31-2A, and the second planarizing region is formed of a second planarizing film 32-2A composed of the same material as the first planarizing film 31-2A.

The separation grooves 33-1 and 33-2 of the planarizing layers 30-1A and 30-2A are provided for separating the first planarizing films 31-1A and 31-2A from the second planarizing films 32-1A and 32-2A (around the first planarizing films 31-1A and 31-2A) via air layer to thereby create difference in refractive index. The planarizing layers 30-1A and 30-2A are formed of organic insulation material such as Novolak-base resist, acrylic resin, polyimide resin, epoxy resin, SOG (Spin coating On Glass) or the like, or inorganic material such as SiN, SiO$_2$, Al$_2$O$_3$ or the like, as was described in Embodiment 1.

The semiconductor light emitting elements 10-1, 10-2 and 10-3, the interlayer insulation film 16, the upper electrode 17, the lower electrode 18, upper electrode wirings 21-1, 21-2 and 21-3, lower electrode wirings 22-1, 22-2 and 22-3 are configured as described in Embodiment 1. The semiconductor light emitting elements 10-1, 10-2 and 10-3 are configured to transmit the light from the lower semiconductor light emitting elements 10-1 and 10-2 to the upward direction as described in Embodiment 1. The above described modifications of Embodiment 1 are also applicable to Embodiment 2.

<Manufacturing Method>

The manufacturing method of the layered semiconductor light emitting device 1A according to Embodiment 2 is different from that of Embodiment 1 in that separation grooves 33-1 and 33-2 are respectively formed after the respective planarizing layers 30-1A and 30-2A are formed (using the material described in Embodiment 1).

In the case where the planarizing layers 30-1A and 30-2A are formed of the organic insulation material having photosensitivity, the separation grooves 33-1 and 33-2 can be formed using photolithographic technique. In the case where the planarizing layers 30-1A and 30-2A are formed of material that does not have photosensitivity or inorganic insulation material, the separation grooves 33-1 and 33-2 can be formed (patterned) using dry etching technique. Each of the planarizing films 31-1A, 31-2A, 32-1A and 32-2A preferably has peak-to-valley surface roughness Ry of 5 μm or less, as was described in Embodiment 1.

In this regard, if the planarizing films 31-1A, 31-2A, 32-1A and 32-2A have large surface roughness due to influence of the semiconductor light emitting elements 10-1 and 10-2, it is possible to planarize the surfaces of the planarizing films 31-1A, 31-2A, 32-1A and 32-2A by polishing. However, in terms of simplifying the manufacturing process, it is preferable to reduce the surface roughness in a process in which the planarizing layers 30-1A and 30-2A are formed.

<Operation>

The separation grooves 33-1 and 33-2 are formed around the first planarizing films 31-1A and 31-2A (disposed between the semiconductor light emitting elements 10-1, 10-2 and 10-3) so as to surround the light emitting regions of the semiconductor light emitting elements 10-1 and 10-2. Therefore, the first planarizing films 31-1A and 31-2A are separated from the second planarizing films 32-1A and 32-2A. Further, the semiconductor light emitting elements 10-2 and 10-3 are respectively bonded onto the first planarizing films 31-1A and 31-2A using intermolecular force without air layer formed therebetween. Therefore, as was described in Embodiment 1, the lights from the semiconductor light emitting elements 10-1 and 10-2 are efficiently conducted to the first planarizing films 32-1A and 32-2A. Additionally, the first planarizing films 31-1A and 31-2A are formed of material with higher refractive index than that of air layer (i.e., the separation grooves 33-1 and 33-2), and therefore function as optical waveguides, with the result that leakage of light can be prevented.

<Effect>

According to Embodiment 2, the same effects as those of Embodiment 1 can be obtained. Further, even when the first planarizing films 31-1A, 31-2A and the second planarizing films 32-1A and 32-2A are formed of the same material, difference in refractive index can be created by the separation grooves 33-1 and 33-2, and therefore the optical waveguide structure is formed above the light emitting regions. Therefore, it becomes possible to simplify the formation of the first planarizing films 31-1A and 31-2A functioning as the optical waveguides.

Embodiment 3

<Structure>

Figure 6:
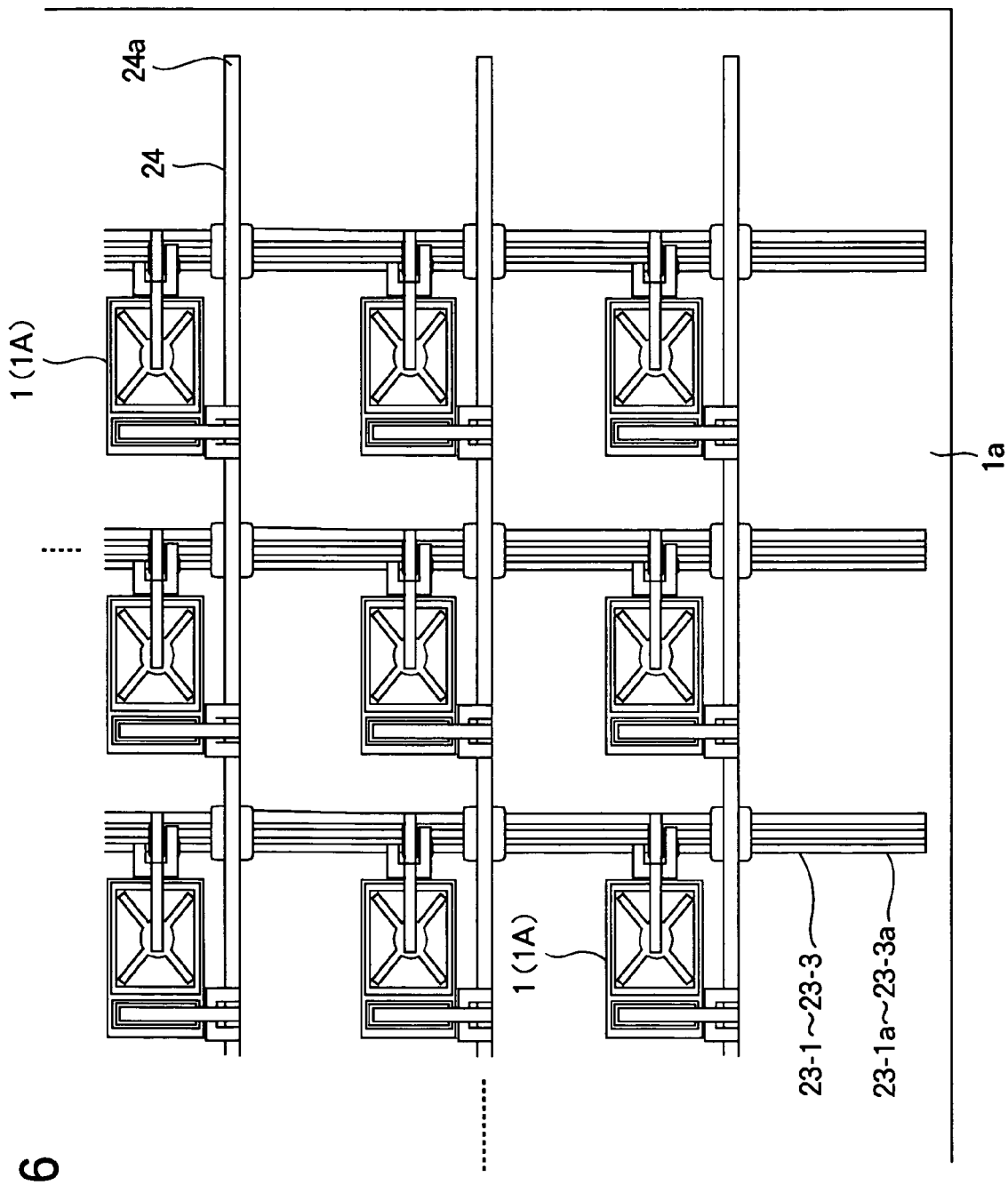
FIG. 6 is an enlarged plan view showing an image forming apparatus according to Embodiment 3 of the present invention.

FIG. 6 is a plan view showing an image forming apparatus according to Embodiment 3 of the present invention. The image forming apparatus according to Embodiment 3 includes the layered semiconductor light emitting device 1 of Embodiment 1 or the layered semiconductor light emitting device 1A of Embodiment 2.

The image forming apparatus according to Embodiment 3 is configured so that, for example, the layered semiconductor light emitting devices 1 of Embodiment 1 or the layered semiconductor light emitting devices 1A of Embodiment 2 are two-dimensionally arranged on the supporting substrate 1a. All of the layered semiconductor light emitting devices 1 (or the layered semiconductor light emitting devices 1A) are electrically connected to each other via the upper electrode common wirings 23-1, 23-2 and 23-3 and the lower electrode 24. The upper electrode common wirings 23-1, 23-2 and 23-3 and the lower electrodes 24 extend to the vicinity of the outer edge of the supporting substrate 1a. In the vicinity of the outer edge of the supporting substrate 1a, connection pads 23-1a, 23-2a and 23-3a (for upper electrode common wirings) and connection pads 24a (lower electrodes) are provided. The connection pads 23-1a, 23-2a and 23-3a and the connection pads 24a are electrically connectable to an external driving circuit.

<Effect>

According to Embodiment 3, the layered semiconductor light emitting devices 1 (or the layered semiconductor light emitting devices 1A) each of which includes the semiconductor light emitting elements 10-1, 10-2 and 10-3 are arranged to a high density so as to form pixels. Due to the effects having been described in Embodiment 1 or 2, leakage of light from each of the layered semiconductor light emitting devices 1 (or the layered semiconductor light emitting devices 1A) can be prevented. Therefore, the light emitted by each pixel is not subject to leakage light emitted from other pixel, and a full-color image forming apparatus with high efficiency can be obtained.

In this regard, it is also possible to arrange the layered semiconductor light emitting devices 1 (or the layered semiconductor light emitting devices 1A) in one dimensionally on the supporting substrate 1a for other purpose.

While the preferred embodiments of the present invention have been illustrated in detail, it should be apparent that modifications and improvements may be made to the invention without departing from the spirit and scope of the invention as described in the following claims.

What is claimed is:

1. A layered semiconductor light emitting device comprising:
    a plurality of semiconductor light emitting elements each of which includes a light emitting region that converts electricity into light and emits said light, said semiconductor light emitting elements being layered in a layering direction perpendicular to said light emitting regions, said semiconductor light emitting elements being bonded to each other via a planarizing layer having an electrical insulation property;
    wherein said planarizing layer comprises:
        a first planarizing region disposed above or below said light emitting regions of said semiconductor light emitting elements in said layering direction, and including a first planarizing film; and
        a second planarizing region other than said first planarizing region, and including a second planarizing film;
    wherein said first planarizing film and said second planarizing film have different properties from each other; and
    wherein, in said layering direction of said semiconductor light emitting elements, said semiconductor light emitting element disposed on an upper side transmits light emitted by said semiconductor light emitting element disposed on a lower side.

2. The layered semiconductor light emitting device according to claim 1, wherein said planarizing layer is formed of an organic insulation film or an inorganic insulation film.

3. The layered semiconductor light emitting device according to claim 1, wherein said semiconductor light emitting elements are bonded to said planarizing layer by intermolecular force.

4. The layered semiconductor light emitting device according to claim 1, wherein said semiconductor light emitting element disposed on said lower side emits light whose wavelength is longer than light emitted by said semiconductor light emitting element disposed on said upper side.

5. The layered semiconductor light emitting device according to claim 1, wherein said semiconductor light emitting elements include at least two kinds of semiconductor light emitting elements selected from:

a semiconductor light emitting element that emits red light;
a semiconductor light emitting element that emits green light; and
a semiconductor light emitting element that emits blue light.

6. An image forming apparatus comprising:
a plurality of said layered semiconductor light emitting devices according to claim 1; and
a substrate on which said layered semiconductor light emitting devices are arranged one-dimensionally or two-dimensionally.

7. The layered semiconductor light emitting device according to claim 1, wherein said first planarizing film has a higher refractive index than air, and said second planarizing film has a lower refractive index than said first planarizing film.

8. The layered semiconductor light emitting device according to claim 1, wherein said first planarizing film and said second planarizing film have different refractive indexes from each other.

9. The layered semiconductor light emitting device according to claim 1, wherein said light emitting regions of said semiconductor light emitting elements overlap each other in said layering direction.

10. The layered semiconductor light emitting device according to claim 1, wherein said semiconductor light emitting elements have upper electrodes, each of which includes a circular portion and a plurality of branches radially extending from the circular portion.

* * * * *